US010389087B2

(12) United States Patent
Leidner et al.

(10) Patent No.: US 10,389,087 B2
(45) Date of Patent: Aug. 20, 2019

(54) METHOD AND APPARATUS FOR SPECTRAL NARROWING AND WAVELENGTH STABILIZATION OF BROAD-AREA LASERS

(71) Applicant: UNIVERSITY OF ROCHESTER, Rochester, NY (US)

(72) Inventors: Jordan P. Leidner, Rochester, NY (US); John R. Marciante, Webster, NY (US)

(73) Assignee: UNIVERSITY OF ROCHESTER, Rochester, NY (US)

( * ) Notice: Subject to any disclaimer, the term of this patent is extended or adjusted under 35 U.S.C. 154(b) by 0 days.

(21) Appl. No.: 15/543,691

(22) PCT Filed: Jan. 25, 2016

(86) PCT No.: PCT/US2016/014672
§ 371 (c)(1),
(2) Date: Jul. 14, 2017

(87) PCT Pub. No.: WO2016/122997
PCT Pub. Date: Aug. 4, 2016

(65) Prior Publication Data
US 2018/0269644 A1    Sep. 20, 2018

Related U.S. Application Data

(60) Provisional application No. 62/109,189, filed on Jan. 29, 2015.

(51) Int. Cl.
*H01S 5/00* (2006.01)
*H01S 5/14* (2006.01)
(Continued)

(52) U.S. Cl.
CPC .......... *H01S 5/147* (2013.01); *H01S 3/06737* (2013.01); *H01S 3/09415* (2013.01);
(Continued)

(58) Field of Classification Search
CPC .. H01S 3/06737; H01S 5/4062; H01S 5/2036; H01S 5/147; H01S 5/141;
(Continued)

(56) References Cited

U.S. PATENT DOCUMENTS 5,793,521 A * 8/1998 O'Brien .................. H01S 5/026
359/344
5,828,491 A * 10/1998 Neuman .............. G02B 5/1871
359/565
(Continued)

FOREIGN PATENT DOCUMENTS

CN    102620815    8/2012
CN    107210575    9/2017
(Continued)

OTHER PUBLICATIONS

Chen, et al., "Broad-area laser diode with 0.02nm Bandwidth and diffraction limited output due to double external cavity feedback," App. Phys. Lett. 85, pp. 525-527, 2004.
(Continued)

*Primary Examiner* — Kinam Park
(74) *Attorney, Agent, or Firm* — Kilpatrick Townsend & Stockton LLP

(57) ABSTRACT

Methods and apparatus for spectral narrowing and wavelength stabilization of broad-area lasers, such as an apparatus including a broad-area laser source configured to emit light along an emission axis in an emission pattern extending along the emission axis, and a single-mode fiber Bragg grating, such as a single-mode core incorporating a fiber Bragg grating embedded in a core of a dual-clad fiber, the single-mode fiber Bragg grating configured to spectrally selectively reflect back light from a sub-aperture portion of the emitted light to the broad-area laser source. The single mode core having the FBG is off-axis in comparison to the central axis of the double-clad fiber and allows for frequency
(Continued)

stabilization of the broad area laser diode output improving its performance as pump laser for a doped fiber amplifier.

22 Claims, 15 Drawing Sheets

(51) Int. Cl.
```
H01S 5/40      (2006.01)
H01S 5/068     (2006.01)
H01S 3/067     (2006.01)
H01S 3/094     (2006.01)
H01S 3/0941    (2006.01)
H01S 5/20      (2006.01)
```
(52) U.S. Cl.
CPC ........ *H01S 3/094007* (2013.01); *H01S 5/068* (2013.01); *H01S 5/14* (2013.01); *H01S 5/141* (2013.01); *H01S 5/146* (2013.01); *H01S 5/2036* (2013.01); *H01S 5/4062* (2013.01); *H01S 5/4081* (2013.01); *H01S 5/4087* (2013.01); *H01S 5/4025* (2013.01)

(58) Field of Classification Search
CPC ........... H01S 3/09415; H01S 3/094007; H01S 5/146; H01S 5/14; H01S 5/4081; H01S 5/4087; H01S 5/4025; H01S 5/068
See application file for complete search history.

(56) References Cited

U.S. PATENT DOCUMENTS

| | | | | |
|---|---|---|---|---|
| 6,002,703 | A * | 12/1999 | Hwu | H01S 5/14 372/108 |
| 6,212,216 | B1 * | 4/2001 | Pillai | G02B 6/425 372/108 |
| 2005/0111105 | A1 * | 5/2005 | Tanaka | G02B 27/0966 359/619 |
| 2006/0106438 | A1 * | 5/2006 | Zemmouri | A61F 9/008 607/89 |
| 2012/0093189 | A1 * | 4/2012 | Fattal | B82Y 20/00 372/50.11 |

FOREIGN PATENT DOCUMENTS

| | | |
|---|---|---|
| EP | 320990 | 6/1989 |
| EP | 3251184 | 12/2017 |
| WO | 2016122997 | 8/2016 |

OTHER PUBLICATIONS

Fricke, et al., "High-power 980-nm broad-area lasers spectrally stabilized by surface Bragg gratings," IEEE Phot. Tech. Lett. 22, pp. 284-286, Mar. 2010.

Hausler, et al., "Suppression of mode switching noise in wavelength stabilized laser diodes by external Bragg gratings," Proc. of SPIE 8605, pp. 86050R-1-10, 2013.

Hayashi, et al., "Design and fabrication of ultra-low crosstalk and low-loss multi-core fiber," Opt. Express 19, 16576-16592, 2011.

International Application No. PCT/US2016/014672, International Preliminary Report on Patentability dated Aug. 10, 2017, 11 pages.

International Application No. PCT/US2016/014672, International Search Report and Written Opinion dated Jul. 5, 2016, 18 pages.

International Application No. PCT/US2016/014672, Invitation to Pay Additional Fees and Partial Search Report dated Apr. 26, 2016, 7 pages.

Jechow, et al., "1 W tunable near diffraction limited light from a broad area laser diode in an external cavity with a line width of 1.7 Mhz," Optics Communications 277, pp. 161-165, 2007.

Leidner, et al., Spectral Narrowing and Stabilization for Broad-Area Lasers via Modified Delivery Fiber, IEEE Photonics Technology Letters, vol. 27, No. 18, Sep. 15, 2015, pp. 1927-1930.

Marciante, et al., "Nonlinear Mechanisms of Filamentation in Broad-Area Semiconductor Lasers," IEEE J. Quantum Electron. 32, pp. 590-596, 1996.

Marciante, et al., "Spatio-temporal characteristics of filamentation in broad-area semiconductor lasers," IEEE J. Quantum Electron., vol. 33, 1174-1179, 1997.

Mukherjee, et al., "Electrothermal analysis of CW high-power broad-area laser diodes: a comparison between 2-D and 3-D modeling," IEEE J. Sel. Top. Quantum Electron. 13, pp. 1180-1187, 2007.

Price, et al, "High brightness fiber coupled pump modules optimized for optical efficiency and power," Proc. of SPIE 8605, pp. 860506-1-8, 2013.

Steckman, et al., "Volume holographic grating wavelength stabilized laser diodes," IEEE J. Sek. Top. Quantum Electron. 13 pp. 672-678, 2007.

Wolff, et al., "Fourier-optical Transverse mode selection in external-cavity broad-area lasers: experimental and numerical results," IEEE J. Quantum Electron. 39, 2003, pp. 448-458.

CN201680007714.2, "Office Action", dated Jan. 31, 2019, 14 pages.

\* cited by examiner

METHOD AND APPARATUS FOR SPECTRAL NARROWING AND WAVELENGTH STABILIZATION OF BROAD-AREA LASERS

CROSS-REFERENCE TO RELATED APPLICATION

This application claims priority to U.S. Provisional Application No. 62/109,189, filed Jan. 29, 2015, which is incorporated herein by reference in its entirety.

RELATED FIELDS

Spectral narrowing and wavelength stabilization of broad-area lasers.

BACKGROUND

Broad-area lasers (BALs) are used for optical pumping and material processing due to their wavelength selectability and high electrical to optical efficiency. However, they have both spectrally and spatially erratic emission caused by multi-mode operation, thermally induced refractive index changes, and refractive index changes induced by non-uniform gain. These effects lead to 9xx-band BALs having spectral widths from 2-6 nm at peak operating power and spectra that drift 0.3-0.4 nm per degree Kelvin. These characteristics can become problematic when strong interactions with a material's narrow absorption peak are desired (e.g., pumping ytterbium-doped fiber lasers).

Selective laser feedback has been used in the past in at least some instances and applications to modify the spectral behavior of a laser. In broad-area laser diodes, two such techniques are the inclusion of a distributed Bragg reflector on the diode or using a volume Bragg reflector in an external cavity configuration. While a distributed Bragg reflector that is monolithically integrated with the diode does not require physical alignment to narrow a BALs spectral output, such devices still suffer from wavelength variability due to temperature and, therefore, operating power. Alternatively, volume Bragg gratings are more robust to temperature changes, but must be carefully aligned and tend to have scattering losses that reduce the overall output power efficiency.

SUMMARY

We have developed apparatus and methods using a single-mode fiber Bragg grating (FBG) to narrow and stabilize the emission wavelength of commercial BALs. In some non-limiting examples, this technique is also shown to enhance the output power, unlike the volume Bragg grating (VBG) approach, and to modify the far-field (FF) emission pattern with the potential to improve the slow-axis beam quality. In one non-limiting example, our inventions are embodied in a novel pump delivery fiber geometry for integration into conventional packaged systems.

The lasing behavior of BALs can be drastically changed by, in some non-limiting examples, utilizing a highly reflective FBG and angularly selective feedback from the far field. This has been demonstrated by an experiment in which the spectral content of a 3.0 A commercial BAL was narrowed by a factor of 10.6 down to 0.26 nm. In at least some instances, these techniques are independent of the laser diode temperature. In some examples, our methods include a spatially and spectrally selective reflector in the FF, which also enhances the emitted power (without increasing emission angle) and thus increases spatial brightness of the BAL by up to 13% at its intended operating power, and in at least some instances also causes a change in FF profile shape and improving beam quality. Embodiments of our novel pump delivery fiber configurations may be rapidly integrated into current manufacturing environments and significantly enhance the benefits attained by embodiments of this technique for commercial high-power diode pump laser systems.

In one non-limiting embodiment, an apparatus includes a broad-area laser source configured to emit light, the emitted light comprising an emission axis and an emission pattern extending along the emission axis, the emission pattern comprising a sub-aperture portion located off of the center of the emission axis; a single-mode fiber associated with a fiber Bragg grating configured to spectrally selectively reflect back light from the sub-aperture portion to the broad-area laser source; and coupling optics configured to couple at least a portion of the sub-aperture portion to the single-mode fiber.

In some instances, the sub-aperture portion is a sub-aperture far-field portion.

In some instances, the single-mode fiber is a core of a dual-clad fiber.

In some instances, the coupling optics are configured to couple substantially all of the emitted light to the dual-clad fiber.

In some instances, the dual-clad fiber extends along a longitudinal central axis, and the single-mode fiber core is offset from the longitudinal central axis.

In some instances, the dual-clad fiber further includes a second single-mode fiber core offset from the longitudinal central axis of the dual-clad fiber.

In some instances, the emission pattern includes a second sub-aperture portion located off of the center of the emission axis and wherein the second single-mode fiber core is associated with a second fiber Bragg grating configured to spectrally selectively reflect back light from the second sub-aperture portion to the broad-area laser source.

In some instances, the apparatus further includes a second broad-area laser source configured to emit light, the emitted light from the second broad-area laser source including a second emission axis and a second emission pattern extending along the second emission axis, the second emission pattern including a second sub-aperture portion located off of the second emission axis; and a second single-mode fiber associated with a fiber Bragg grating configured to spectrally selectively reflect back light from the second sub-aperture portion to the second broad-area laser source.

In some instances, the single-mode fiber and the second single-mode fiber are cores of a dual-clad fiber.

In some instances, the dual-clad fiber includes an input face, the emission pattern and the second emission pattern are incident on the input face, and the emission pattern and the second emission pattern are non-overlapping at the input face.

In some instances, the dual-clad fiber includes an input face, the emission pattern and the second emission pattern are incident on the input face, and the emission pattern and the second emission pattern include overlapping portions and non-overlapping portions at the input face.

In some instances, the single-mode fiber and the second single-mode fiber are located at at least some of the non-overlapping portions of the emission pattern and the second emission pattern at the input face.

In some instances, the broad-area laser source has an emission spectrum, the emission spectrum having a spectral width, the spectral width having a full width at a half maximum intensity of the emission spectrum; and the spectrally selective reflection of the fiber Bragg grating narrows the spectral width of the emission spectrum by at least a factor of 3.

In some instances, the emitted light of the broad-area laser source has a brightness; and the spectrally selective reflection of the fiber Bragg grating increases the brightness of the emitted light by at least 5%.

In some instances, the emission pattern has a far-field spatial profile; and the spectrally selective reflection of the fiber Bragg grating changes the far-field spatial profile of the emission pattern.

In some instances, the coupling optics comprise slow-axis Fourier-transform optics.

In another non-limiting embodiment, a dual-clad fiber includes: a cladding; a multi-mode core within the cladding; and an offset single-mode core embedded in the multi-mode core, the single-mode core associated with a fiber Bragg grating.

In some instances, the dual-clad fiber has a central longitudinal axis along which the dual-clad fiber extends, and the single-mode core is offset from the central axis.

In some instances, the dual-clad fiber also includes a second offset single-mode core embedded in the multi-mode core, the second single-mode core associated with a second fiber Bragg grating.

In some instances, the dual-clad fiber includes an input face; and the first offset single-mode core, second offset single-mode core, and central longitudinal axis are linearly positioned relative to one another at the input face.

In some instances, the dual-clad fiber includes an input face; and the first offset single-mode core, second offset single-mode core, and central longitudinal axis are non-linearly positioned relative to one another at the input face.

In some instances, the dual-clad fiber has a first side and a second side opposite the first side, the central longitudinal axis is between the first and second sides, the single-mode core is located in the first side, and the second single-mode core is located in the second side.

In some instances, the dual-clad fiber has a first side and a second side opposite the first side, wherein the central longitudinal axis is between the first and second sides, and the single-mode core and the second single-mode core are both located in the first side.

In another non-limiting embodiment, an apparatus includes: a broad-area laser source configured to emit light, the emitted light comprising an emission axis and an emission pattern extending along the emission axis, the emission pattern comprising a sub-aperture far-field portion located off of the emission axis; and a single-mode fiber Bragg grating configured to spectrally selectively reflect back light from the sub-aperture far-field portion to the broad-area laser source.

In some instances, the broad-area laser source has an emission spectrum, the emission spectrum has a spectral width, the spectral width has a full width at a half maximum intensity of the emission spectrum; and the spectrally selective reflection of the single-mode fiber Bragg grating narrows the spectral width of the emission spectrum by at least a factor of 3.

In some instances, the broad-area laser source has an emission spectrum, the emission spectrum has a spectral width, the spectral width has a full width at a half maximum intensity of the emission spectrum; and the spectrally selective reflection of the single-mode fiber Bragg grating narrows the spectral width of the emission spectrum by a factor of between 2 and 20.

In some instances, the emitted light from the broad-area laser source has a far-field intensity profile; and the spectrally selective reflection of the single-mode fiber Bragg grating enhances at least some portions of the far-field intensity profile.

In some instances, the spectrally selective reflection of the single-mode fiber Bragg grating alters a shape of the emission pattern of the broad-area laser source.

In some instances, the single-mode fiber Bragg grating is embedded in a core of a dual-clad fiber.

In some instances, the spectrally selective reflection of light by the single-mode fiber Bragg grating is limited to spectrally selective reflection of light from the sub-aperture far field portion located off of the emission axis.

DETAILED DESCRIPTION

Figure 1:
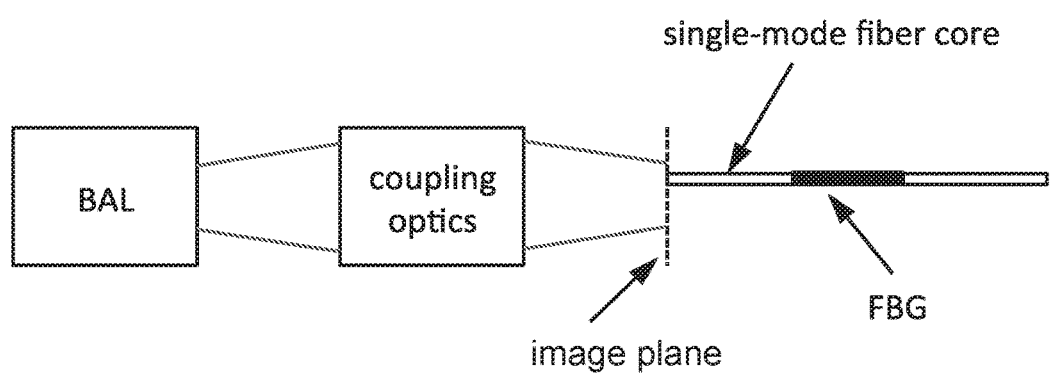
FIG. 1 schematically depicts a non-limiting example of FBG sub-aperture feedback. The coupling optics can generate an image of the far-field, the near-field, or an intermediary field.

FIG. 1 illustrates a non-limiting example of an apparatus in which an off-axis portion of a BAL's slow-axis emission is selectively fed back into the BAL (the slow-axis emission may be, in some non-limiting embodiments, a double-lobed FF emission). In FIG. 1, feedback from a single-mode fiber incorporating an FBG acts as a narrow spectral and spatial filter whose nearly Gaussian apodization (provided by the fiber mode shape) serves to reduce the excitation of undesired spatial modes.

Figure 2:
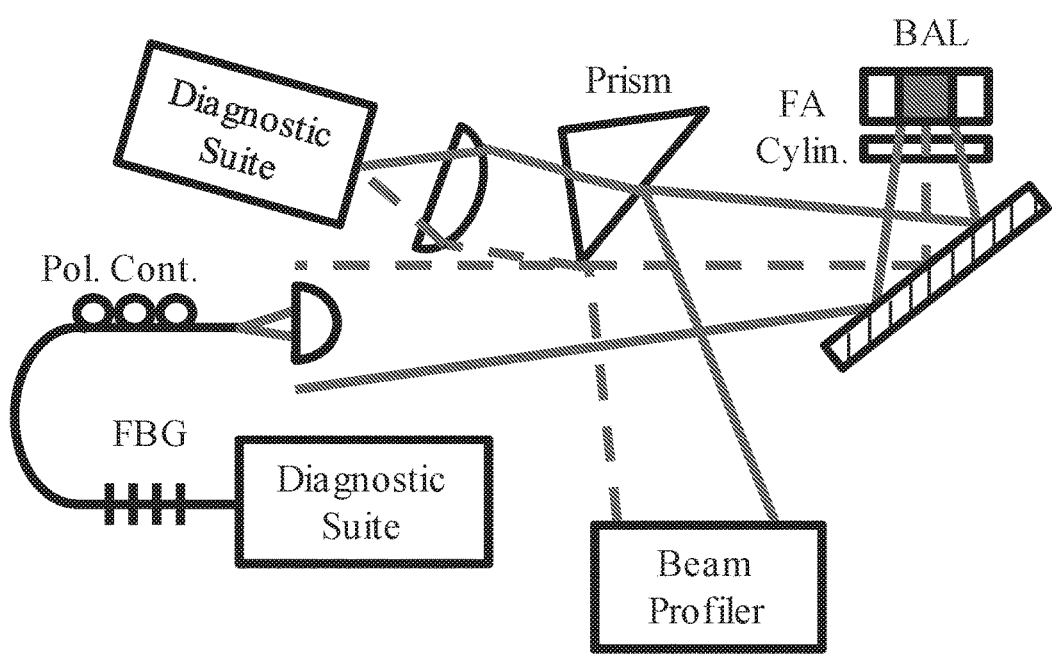
FIG. 2 schematically depicts an experiment demonstrating FBG sub-aperture far-field feedback.

FIG. 2 schematically depicts an experiment demonstrating FBG sub-aperture far-field feedback, with FIGS. 3-8 depicting some of the data from that experiment, which is discussed further in Section 1 below. In the experiment of FIG. 2, the slow-axis FF of the BAL is accessed via free-space propagation, which will usually not be the case in packaged laser systems. As discussed further in Section 2 below, FIGS. 9-15 illustrate several non-limiting examples of optical fibers with one or more off-axis single-mode FBG-incorporating cores that can be optically coupled to one or more BALs in packaged systems to narrow and stabilize the emission wavelength of the BAL, modify the FF emission pattern, and capture all or almost all of the BAL's output power.

1. Experimental Results.

FIG. 2 schematically illustrates an experiment in which an off-axis portion of a BAL's slow-axis double lobed FF emission was selectively fed back into the BAL. The experimental setup illustrated in FIG. 2, and the data obtained from the experiment (some of which are illustrated in FIGS. 3-8) while illustrative of our invention, are examples only and not intended to limit the scope or application of our inventions. Those of skill in the art will recognize that the inventions described in this patent may be applied in a wide variety of manners to obtain a wide variety of effects.

In FIG. 2, FA Cylin. is a cylindrical lens system in the fast-axis of the diode. Pol. Cont. is a fiber polarization controller that ensures correct polarization for coupling back into the BAL. The diagnostic suite consists of interchangeable power detectors and an optical spectrum analyzer.

In FIG. 2, the reflective front and back surfaces of the BAL define one optical lasing cavity. The back surface of the BAL and the FBG in the optical fiber define a second laser cavity, with all three of these surfaces forming a compound cavity, and contribute to the operation of the narrowed system. Those of skill in the art will recognize that a laser with optical feedback represents the same physical system as a compound cavity laser. The present invention is not limited to compound cavity apparatus and methods, however. For example, in some embodiments, the emission-side reflective surface of the BAL could instead have an anti-reflective coating, resulting in the setup of FIG. 2 being closer to a single cavity design.

The FBG used in the experiment of FIG. 2 was measured to have 98% reflectivity, 1.0 nm full-width half-max reflectivity, and peak reflectivity at 973.9 nm. In other embodiments, FBG's having other characteristics may be employed. In some instances, the FBG may have greater than 60% reflectivity, greater than 70% reflectivity, greater than 80% reflectivity, greater than 90% reflectivity, or greater than 95% reflectivity, greater or less than 1.0 nm full-width half-max reflectivity (e.g., between 0.01 and 4 nm), and peak reflectivity at other wavelengths depending on the particular application and desired effect. In other embodiments, e.g. when using double FBGs or when using an FBG with an AR-coated facet, FBG's with lower reflectivity may be employed, in some instances with a reflectivity as low as 5%. One skilled in the art recognizes that there are many ways to produce an FBG with narrow linewidth, including concatenated FBGs with spectrally overlapping features, etc.

The BAL used in the experiment of FIG. 2 was specified to operate at 977 nm at full power (~3 W) but was cooled to more closely match the FBG wavelength. In other embodiments, other BALs may be used with or without temperature control. Due to low reflectivity coatings on commercial BALs, only a relatively small amount of external feedback is required in this particular instance to drastically change the lasing behavior. A modest 3.2% of the BAL output power was coupled to single-mode fiber prior to enabling feedback via the FBG. The spectral widths were measured as the full width at the half maximum (FWHM). The BAL used in the experiment of FIG. 2 is only one non-limiting example of a BAL useable with our invention.

Figure 3:
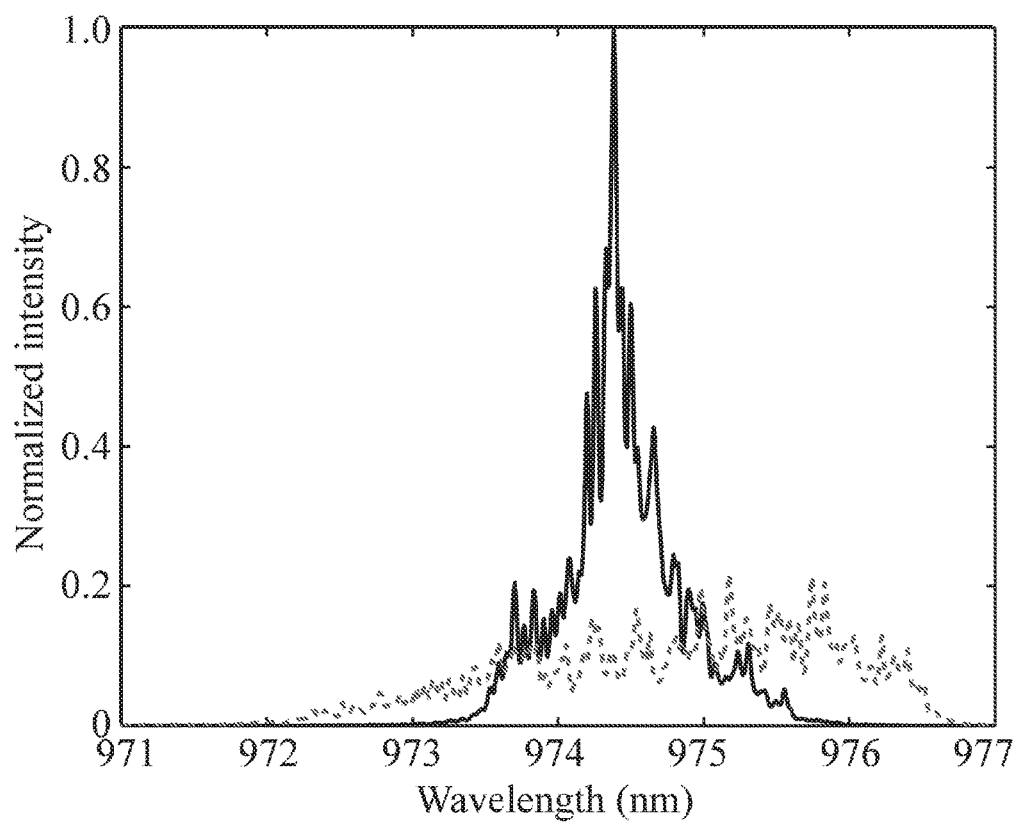
FIG. 3 depicts a BAL spectrum with narrowband, single-mode, FBG feedback (solid) compared to that of a free-running BAL (dashed) operating at 3.0 A from the experiment of FIG. 2.

FIG. 3 shows the spectral impact of the sub-aperture FF FBG feedback in the experiment of FIG. 2. Operating at 3.0 A, the BAL emission spectrum had a spectral width of 0.26 nm with feedback, a factor of 10.6 times narrower than the 2.8 nm width of the isolated emission. In all cases, the spectrum peak was not observed to shift from 974.4 nm or significantly broaden for a range of operating powers and temperatures ranging from 14.2° C. to 20.8° C., despite shifts in the free-running laser wavelength over this range.

Figure 4:
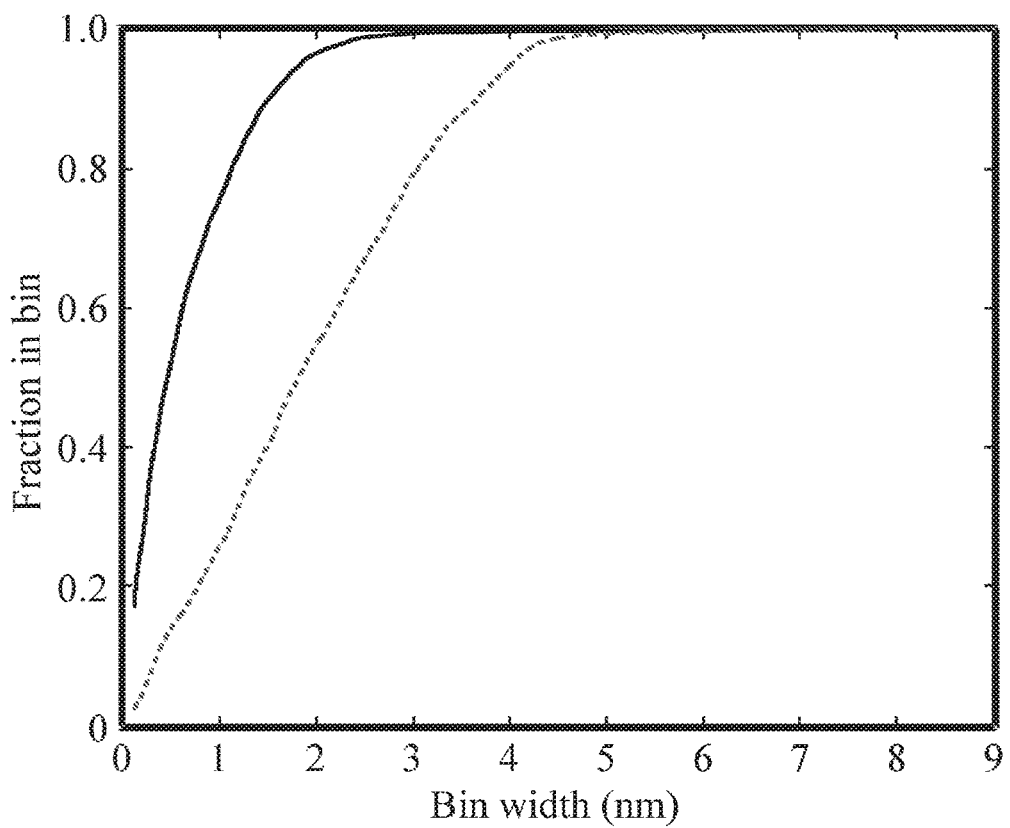
FIG. 4 depicts a fraction of power in a spectral bin centered on the emission peak for the sub-aperture feedback device (solid) and free-running device (dashed) from the experiment of FIG. 2.

Of interest for some embodiments employed in pumping applications is the spectral density of the emission. The fraction of the output spectra emitting into specific spectral bins (centered on the emission peak) was calculated for the BAL emission with and without feedback in the experiment of FIG. 2. FIG. 4 shows the results for both cases as a function of the spectral bin width. Using a practical metric for containing most of the emission as 95%, the spectral width of the BAL with feedback is less than half that of the free-running BAL. Given the very narrow FWHM but wide pedestal of the feedback spectrum shown in FIG. 3, it is expected that greater feedback would eliminate the pedestal in at least some instances, further narrowing the total spectrum, allowing for greater utility in narrow absorption bands and significant benefits over the conventional (non-feedback) case in at least some instances.

Figure 5:
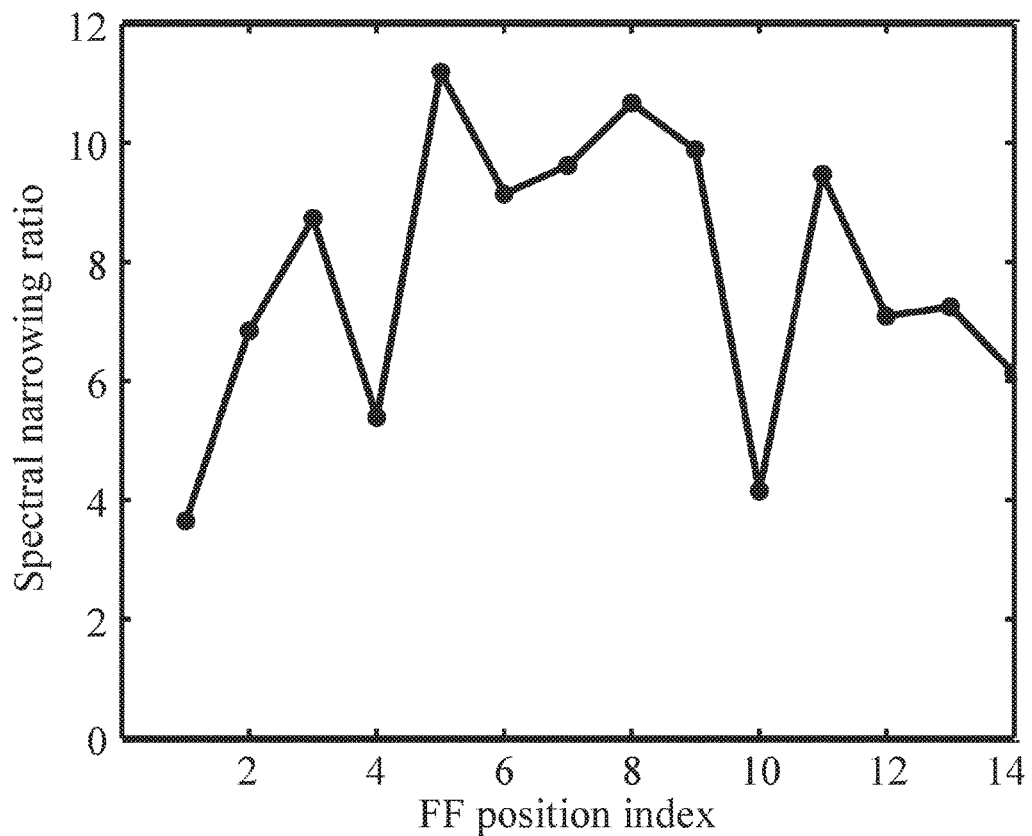
FIG. 5 depicts a ratio of the spectral FWHM of the free-running BAL to the compound cavity BAL over a range of FF feedback positions from the experiment of FIG. 2.

One aspect of practical laser architecture in at least some instances is the sensitivity to the particular configuration. FIG. 5 shows the ratio of the FWHM of conventional BAL to that of the compound cavity device of FIG. 2 with feedback provided from a range of positions in the FF. Position 1 is located near the central axis of the emission and increasing positional indexes corresponding to increasingly off-axis feedback. Position 14 is near the edge of the far field, meaning that the range of FF position indexed covers nearly the entire span of the nominal laser output (half) FF. The optimal spectral narrowing in this non-limiting embodiment was observed near the peak of FF emission, likely due to increased coupling and feedback to preferentially lasing spatial patterns. In this instance, the range of coupling covers a large fraction (~25%) of the nominal FF emission, indicating that commercial application of this technique will be robust against conventional fabrication and alignment tolerances.

In FIG. 5, the ratio of the spectral FWHM of conventional BAL to that of the compound cavity device with feedback provided from a range of positions corresponding to off-axis feedback angles in the FF. Embodiments of this optimum feedback position may be between 0.5 degrees off-axis and the maximum supported off-axis emission from the diode used (typically but not limited to between 3 to 6 degrees).

Figure 6:
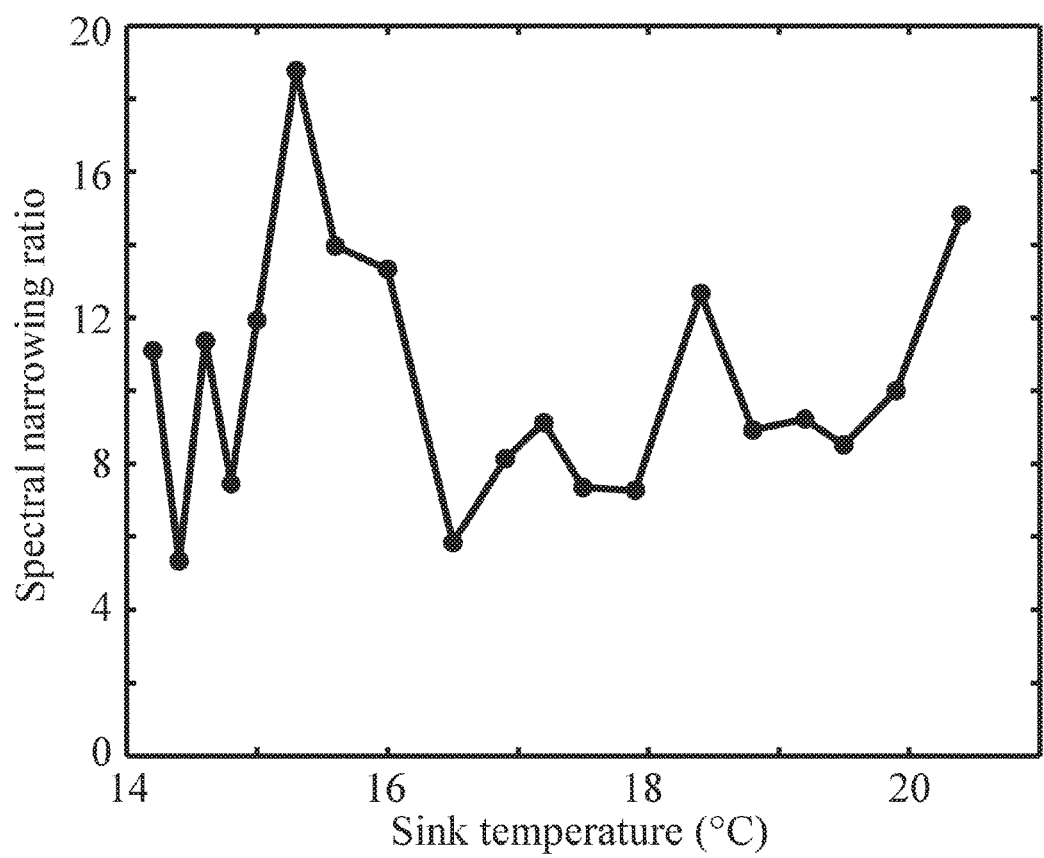
FIG. 6 depicts a ratio of the spectral FWHM of the free-running BAL to the compound cavity BAL over a range of heat-sink temperatures from the experiment of FIG. 2.

FIG. 6 shows the ratio of the FWHM of the conventional BAL to that of the compound cavity BAL of FIG. 2 as a function of heat-sink temperature ranging from 14.2° C. to 20.4° C. Over the temperature range of the measurements, the spectral peak of the BAL with FBG feedback remained fixed to 974.4 nm even though the free-running BAL shifted in wavelength by ~4 nm. The experimental coupling system exhibited some variability with temperature, noted most prominently by the factor of 18.8× improvement at 15.3° C., with more reproducible results obtained around 10× improvement. These results indicate that, in at least some instances: (a) a packaged system would yield more reproducible results than those obtained on an optical table, (b) increasing the thermal stability of the system mechanics (for example, in a packaged system) would aide in coupling and allow for increased performance and thermal wavelength stability; and (c) although 10× spectral narrowing was routinely and stably observed, the spectrum may be able to be narrowed by perhaps another factor of two given a more thermally and mechanically stabilized package.

Figure 7:
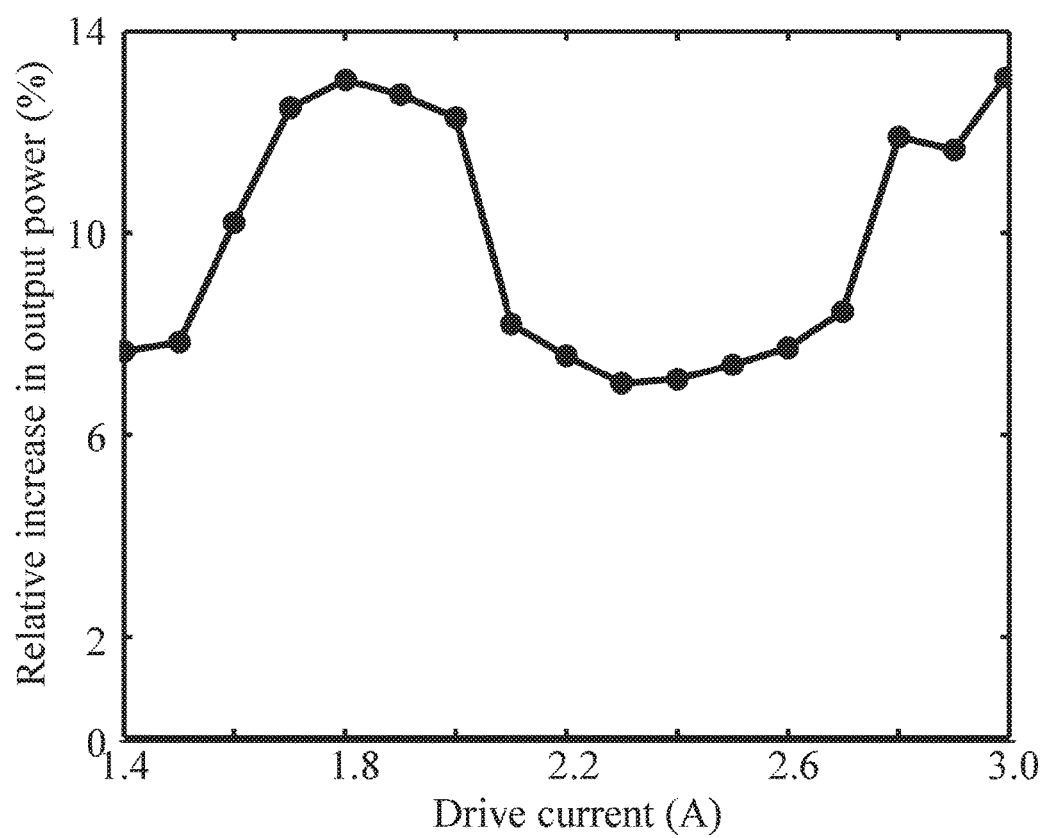
FIG. 7 depicts a percent increase in BAL output power with FF FBG feedback over free-running BAL as a function of drive current from the experiment of FIG. 2.

In addition to the spectral impact of this FBG feedback in the experiment of FIG. 2, favorable changes to the emitted power (favorable for at least some applications and instances) were measured, as were changes in the FF slow-axis emission pattern. FIG. 7 shows the increase in output power of the external-feedback BAL to the free-running BAL. Increases in emitted power from 7-13% were measured in the 1.4-3.0 A regime, with 13% measured at 3 A (maximum available) current. This relative power increase exhibits variation because the emission pattern of the BAL, and therefore the relative impact of the feedback, changes with current since the fiber was fixed at one location in the far field for this experimental measurement. As the output power increases, high intensity FF features can move on and off of the single-mode fiber, causing variation in feedback to the BAL. At these moderate-to-high power levels, the relative amount of coupling stays reasonably high with varied power, indicating that positional tuning is unnecessary for the primary benefits of this configuration. However, in at least some instances, it may be desirable that the location of the fiber in the FF plane be optimized for each given BAL design. In the configuration of FIG. 2, the power measurement was taken from half of the diode's FF emission and thus potentially only shows a change in the symmetry of the output. However the chaotic nature of gain-index coupling in BALs implies that the output should be spatially distributed primarily by the gain pattern of the device and not directly by the feedback, as indicated in FIG. 8.

Figure 8:
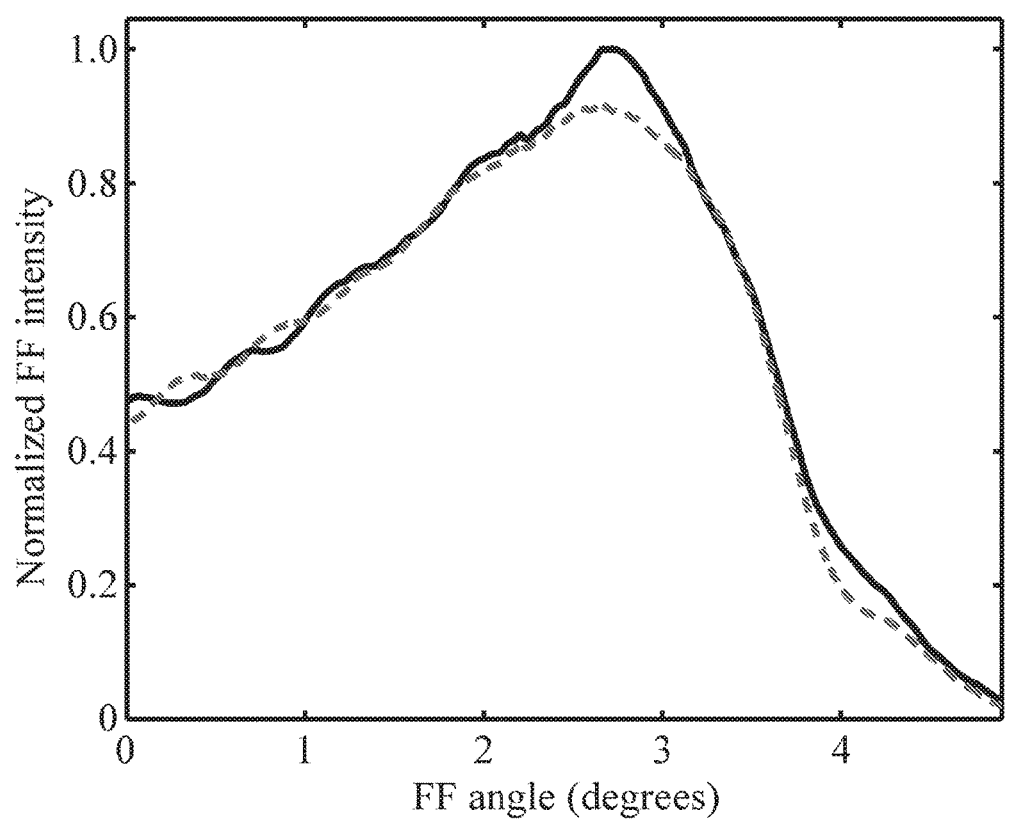
FIG. 8 depicts an intensity profile for half of the BAL FF profile (centered at zero degrees) with feedback (solid) and while free-running (dashed) from the experiment of FIG. 2.

Perturbation to the internal spatial behavior of the BAL due to feedback from the single-mode fiber FBG in the system of FIG. 2 is indicated by the half-FF profiles recorded in FIG. 8. This figure shows that the feedback causes an enhanced peak at the location of the FF feedback. In this instance, the nature of the change in the FF profile is dependent on the segment of the FF that is fed back to the BAL. In addition, the FF feedback location was selected, in this non-limiting example, to maximize the performance, which is nominally accomplished by enhancing the existing dominant spatial profile in the laser. Although only a slight change in the FF profile is shown, increased feedback can potentially simultaneously improve the sharpness of the FF lobes as well as power and efficiency. The result could be a significantly higher brightness BAL with improved spectral purity. For example, in some embodiments utilizing single FBG feedback, a 7-30% increase in brightness could be achieved. In some embodiments utilizing double FBG feedback, such as in FIG. 15 discussed below, brightness increases of 500-1000% could be expected.

2. Apparatus Using Optical Fibers with One or More Off-Axis Single-Mode Cores Incorporating FBGs.

Figure 9:
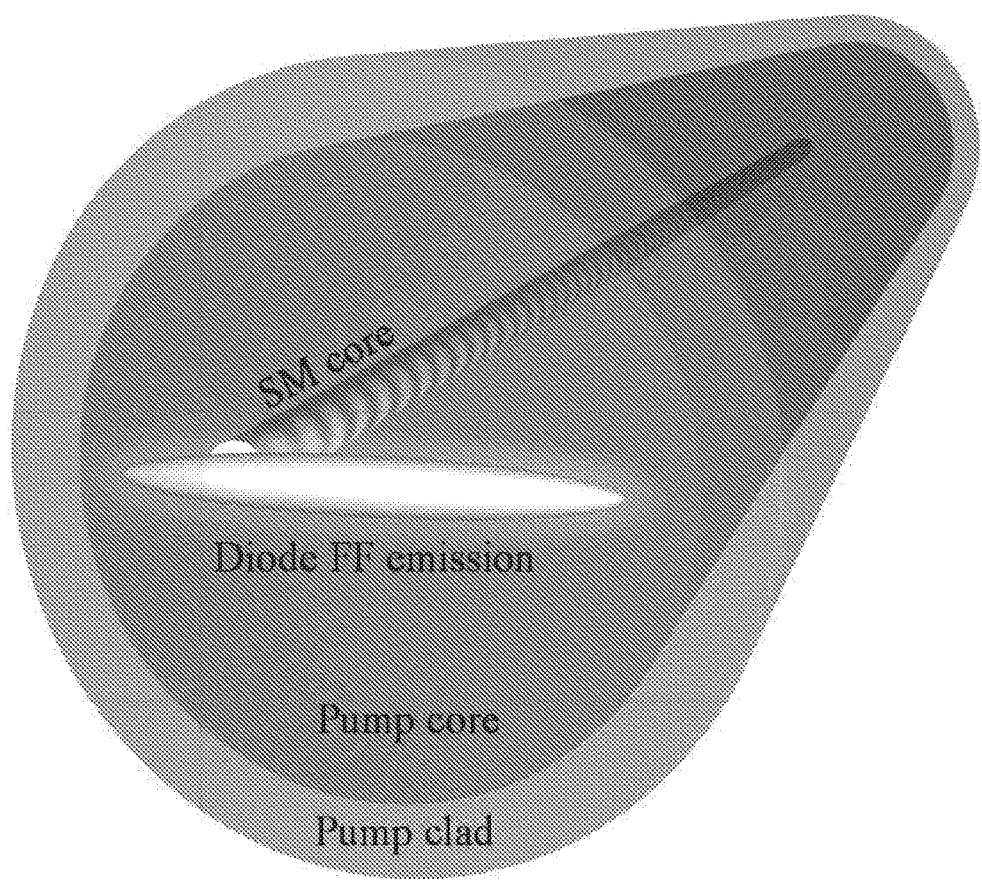
FIG. 9 depicts a non-limiting example of a delivery fiber with off-axis embedded core incorporating an FBG configured for sub-aperture FBG feedback.
Figure 10:
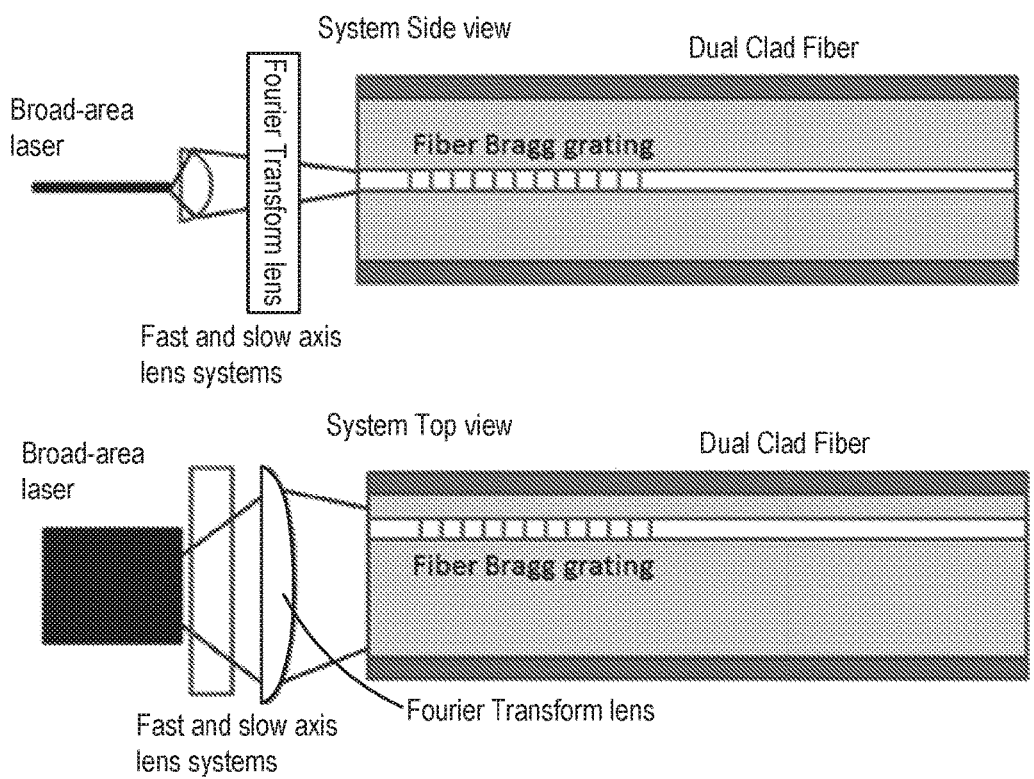
FIGS. 10-15 depict additional non-limiting examples of delivery fibers for use in sub-aperture FBG feedback.

Though the experiment illustrated by FIG. 2 accesses the slow-axis FF of the BAL via free-space propagation, in at least some embodiments, the slow-axis FF could be accessed in the Fourier plane of a cylindrical lens, such as shown in the example illustrated in FIG. 10. As shown in FIG. 10, the apparatus includes slow-axis Fourier-transform optics, in combination with conventional fast-axis optics, to focus the desired slow-axis FF for coupling into a high-power delivery fiber. However, to enable the beneficial spectral-narrowing effects of the proposed technique in this particular embodiment, this multi-mode delivery fiber has an embedded off-axis single-mode core incorporating an FBG, as depicted in FIGS. 9 and 10 for some embodiments of the invention. This apparatus, in at least some instances, captures substantially all light emitted from the BAL for its intended purposes such as optical pumping or machining. In some embodiments, the apparatus captures more than 50% of the light emitted from the BAL, 75% or more of the light emitted from the BAL, 90% or more of the light emitted from the BAL, 95% or more of the light emitted from the BAL, or 99% or more of the light emitted from the BAL. In other words, in spite of the feedback configuration, the dual-clad-fiber-like implementation of the concept captures all of the light emitting from the diode laser. These non-limiting examples shown in FIGS. 9 and 10 are in stark contrast to many feedback techniques by which only half of the light may be used, or where filtering techniques cause large intra-cavity loss. The examples shown in FIGS. 9 and 10 should have a lower amount of scattered light compared to using a volume Bragg grating, which nominally results in reduced output power relative to the free-running laser. In addition, any residual scattering in the present configuration is likely to still be captured by the multi-mode delivery fiber.

The example shown in FIG. 10 may be a compound cavity or a single cavity device. In some embodiments of single cavity configurations, the embedded off-axis single-mode core incorporating the FBG acts as one of the cavity mirrors, with the emission side of the BAL including an AR coating.

FIGS. 9 and 10 illustrate examples of single-armed feedback. In some instances, greatly enhanced spatial and spectral properties may be obtained from double-armed feedback. While implementing this in a system similar to FIG. 2 would nominally severely limit the extractable power due to the geometry of having feedback from both sides of the emission, the invention presented here, in at least some embodiments, would capture substantially all of the emission using the delivery fiber architecture. Double-armed feedback could be readily accomplished, for example, with a second FBG-incorporating core mirrored about the central axis of the multi-mode fiber.

For spatially tiling multiple BALs typical in higher-power systems, multiple such FBG-incorporating cores could be included for each laser using standard multi-core fiber fabrication techniques.

Figure 11:
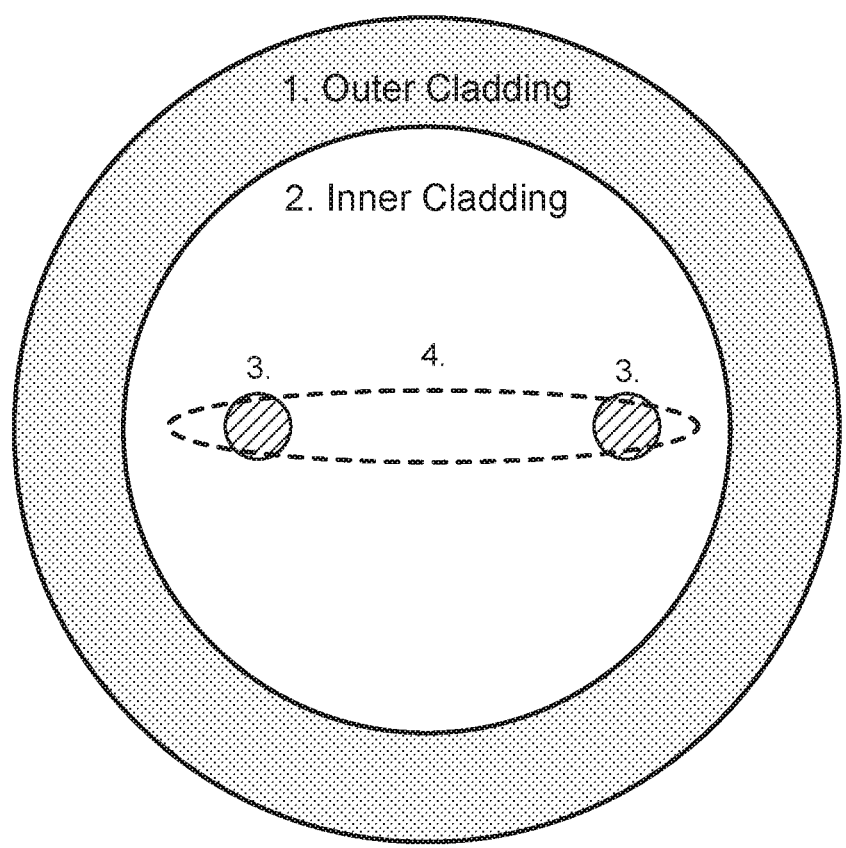
Figure 12:
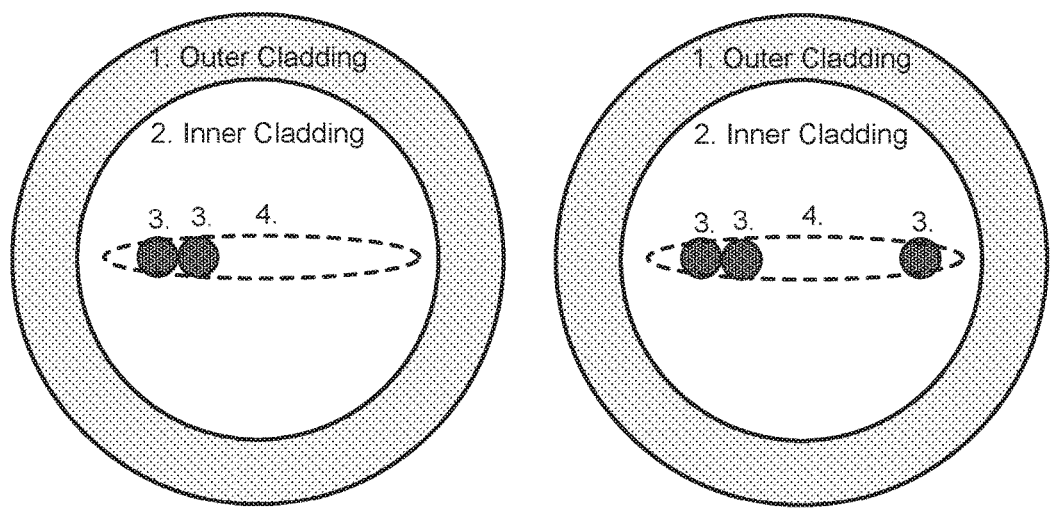

FIGS. 11-15 illustrate various non-limiting examples of a delivery fiber with multiple off-axis embedded cores each incorporating an FBG configured for sub-aperture FBG feedback. FIG. 11 shows one example of double feedback, showing a fiber cross sectional view with reference 1 indicating the outer cladding of the multimode fiber, reference 2 indicating the inner cladding, reference 3 indicating embedded cores incorporating fiber Bragg gratings, and reference 4 indicating position of incident semiconductor laser beam on the fiber input face. In the example of FIG. 11, the two embedded cores are equally spaced in distance from the center of the inner cladding. In other embodiments, two or more cores may be spaced different distances from the center of the inner cladding. In FIG. 11, the two embedded cores are dual-sided—i.e. they are arranged on opposite sides from the center of the inner cladding. In other embodiments, e.g. as shown in FIG. 12, multiple cores may be located on one side of the inner cladding (as shown in the example on the left) or may be may be a combination of single and dual sided (as shown in the example on the right). FIGS. 11 and 12 represent alternative arrangements for increasing the total feedback into the BAL and/or using multiple FBGs to reduce the net emission bandwidth.

Figure 13:
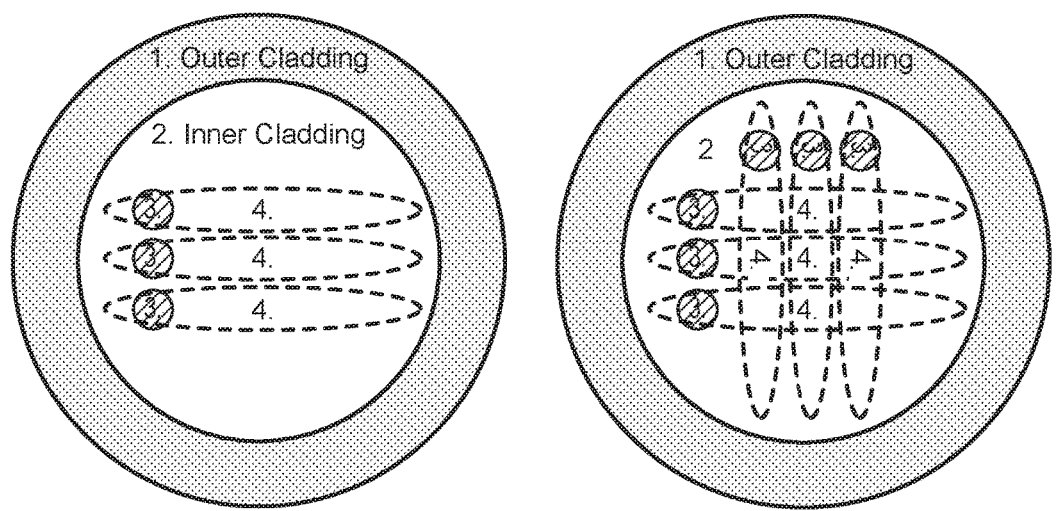
Figure 14:
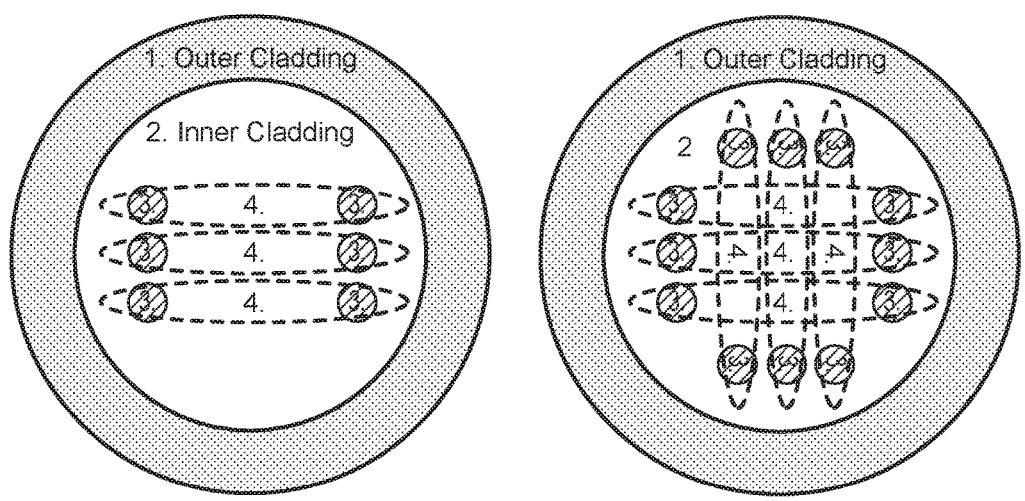

FIG. 13 shows two examples of multi-beam feedback, and FIG. 14 shows two examples of multi-beam, dual feedback. As shown in FIGS. 13 and 14, the centers of the embedded cores and the center of the inner cladding need not all be co-linear with respect to one another. As also shown in FIGS. 13 and 14, multiple lasers may be coupled into a single fiber. FIG. 13 (left) shows a single-core feedback configuration for a high-brightness stacking configuration of a BAL array. FIG. 13 (right) shows the same as FIG. 13 (left) for two BAL arrays that are spatially rotated by 90 degrees such that they can be polarization combined into a single fiber. FIG. 14 shows examples of dual-core feedback for the same cases as FIG. 13. Other dual-core and multi-core arrangements are also possible and contemplated. For example, the core arrangements illustrated in FIG. 12 could be implemented in BAL arrays like those of FIGS. 13 and 14.

Figure 15:
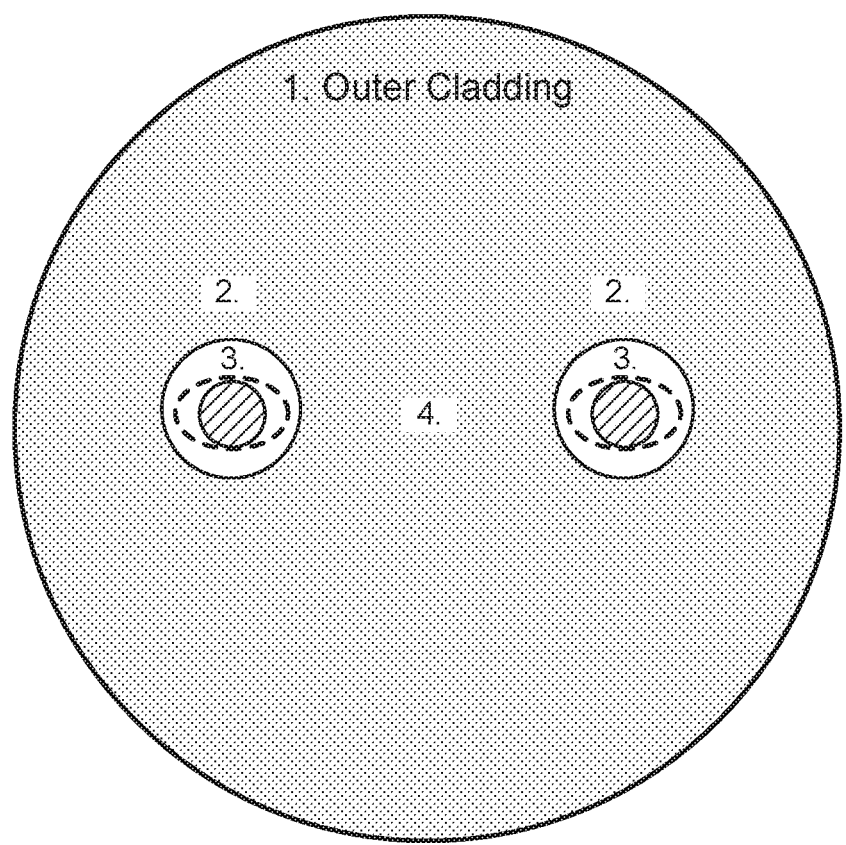

With the potential to modify beam quality, embodiments of our techniques could also allow the use of smaller diameter for the multi-mode fiber, enhancing brightness of the overall fiber-coupled diode laser system. FIG. 15 shows one example of double-feedback with significantly enhanced brightness. In this example, the inner cladding is significantly reduced in size (and in other examples, could be removed completely) and each output can be later coupled to an additional fiber of matching core and inner cladding parameters. In this example, the reflectivities of the fiber Bragg gratings may be reduced for efficient laser emission. In this example, the output depicted is from a single laser.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. An apparatus, comprising: a broad-area laser source configured to emit light, the emitted light comprising an emission axis and an emission pattern extending along the emission axis, the emission pattern comprising a sub-aperture portion located off of the center of the emission axis; a single-mode fiber associated with a fiber Bragg grating configured to spectrally selectively reflect back light from the sub-aperture portion to the broad-area laser source; and coupling optics configured to couple at least a portion of the sub-aperture portion to the single-mode fiber;

wherein the broad-area laser source comprises an emission spectrum, the emission spectrum comprising a spectral width, the spectral width comprising a full width at a half maximum intensity of the emission spectrum; wherein the spectrally selective reflection of the fiber Bragg grating narrows the spectral width of the emission spectrum by at least a factor of 3.

2. The apparatus of claim 1, wherein sub-aperture portion comprises a sub-aperture far-field portion.

3. The apparatus of claim 1, wherein the single-mode fiber is a core of a dual-clad fiber.

4. The apparatus of claim 3, wherein the coupling optics are configured to couple substantially all of the emitted light to the dual-clad fiber.

5. The apparatus of claim 3, wherein the dual-clad fiber extends along a longitudinal central axis, and wherein the single-mode fiber core is offset from the longitudinal central axis.

6. The apparatus of claim 5, wherein the dual-clad fiber further comprises a second single-mode fiber core offset from the longitudinal central axis of the dual-clad fiber.

7. The apparatus of claim 6, wherein the emission pattern comprises a second sub-aperture portion located off of the center of the emission axis and wherein the second single-mode fiber core is associated with a second fiber Bragg grating configured to spectrally selectively reflect back light from the second sub-aperture portion to the broad-area laser source.

8. The apparatus of claim 1, further comprising: a second broad-area laser source configured to emit light, the emitted light from the second broad-area laser source comprising a second emission axis and a second emission pattern extending along the second emission axis, the second emission pattern comprising a second sub-aperture portion located off of the second emission axis; and a second single-mode fiber associated with a fiber Bragg grating configured to spectrally selectively reflect back light from the second sub-aperture portion to the second broad-area laser source.

9. The apparatus of claim 8, wherein the sub-aperture portion and the second sub-aperture portion comprise sub-aperture far-field portions.

10. The apparatus of claim 9, wherein the single-mode fiber and the second single-mode fiber are cores of a dual-clad fiber.

11. The apparatus of claim 10, wherein the dual-clad fiber comprises an input face, wherein the emission pattern and the second emission pattern are incident on the input face, and wherein the emission pattern and the second emission pattern are non-overlapping at the input face.

12. The apparatus of claim 10, wherein the dual-clad fiber comprises an input face, wherein the emission pattern and the second emission pattern are incident on the input face, and wherein the emission pattern and the second emission pattern include overlapping portions and non-overlapping portions at the input face.

13. The apparatus of claim 12, wherein the single-mode fiber and the second single-mode fiber are located at at least some of the non-overlapping portions of the emission pattern and the second emission pattern at the input face.

14. The apparatus of claim 1, wherein the emitted light of the broad-area laser source comprises a brightness; wherein the spectrally selective reflection of the fiber Bragg grating increases the brightness of the emitted light by at least 5%.

15. The apparatus of claim 1, wherein the emission pattern comprises a far field spatial profile; wherein the spectrally selective reflection of the fiber Bragg grating changes the far field spatial profile of the emission pattern.

16. The apparatus of claim 2, wherein the coupling optics comprise slow-axis Fourier-transform optics.

17. An apparatus, comprising: a broad-area laser source configured to emit light, the emitted light comprising an emission axis and an emission pattern extending along the emission axis, the emission pattern comprising a sub-aperture far-field portion located off of the emission axis; a single-mode fiber Bragg grating configured to spectrally selectively reflect back light from the sub-aperture far-field portion to the broad-area laser source;

wherein the broad-area laser source comprises an emission spectrum, the emission spectrum comprising a spectral width, the spectral width comprising a full width at a half maximum intensity of the emission spectrum; wherein the spectrally selective reflection of the single-mode fiber Bragg grating narrows the spectral width of the emission spectrum by a factor of between 2 and 20.

18. The apparatus of claim 17, wherein the broad-area laser source comprises an emission spectrum, the emission spectrum comprising a spectral width, the spectral width comprising a full width at a half maximum intensity of the emission spectrum; wherein the spectrally selective reflection of the single-mode fiber Bragg grating narrows the spectral width of the emission spectrum by at least a factor of 3.

19. The apparatus of claim 17, wherein the emitted light from the broad-area laser source comprises a far-field intensity profile; wherein the spectrally selective reflection of the single-mode fiber Bragg grating enhances at least some portions of the far-field intensity profile.

20. The apparatus of claim 19, wherein the spectrally selective reflection of the single-mode fiber Bragg grating alters a shape of the emission pattern of the broad-area laser source.

21. The apparatus of claim 17, wherein the single-mode fiber Bragg grating is embedded in a core of a dual-clad fiber.

22. The apparatus of claim 17, wherein the spectrally selective reflection of light by the single-mode fiber Bragg grating is limited to spectrally selective reflection of light from the sub-aperture far field portion located off of the emission axis.

* * * * *